United States Patent
Xie et al.

(10) Patent No.: US 10,980,147 B2
(45) Date of Patent: Apr. 13, 2021

(54) QUICK RELEASE COOLING FAN STRUCTURE WITHOUT WIRES

(71) Applicant: DONGGUAN CITY HANSHUO PLASTIC CO., LTD., Guangdong Province (CN)

(72) Inventors: Hong-Hua Xie, Guangdong Province (CN); Rong-Hua Diao, Guangdong Province (CN); Xiao-Jian Yang, Guangxi Province (CN)

(73) Assignee: DONGGUAN CITY HANSHUO PLASTIC CO., LTD., Dong Guan (CN)

( * ) Notice: Subject to any disclaimer, the term of this patent is extended or adjusted under 35 U.S.C. 154(b) by 302 days.

(21) Appl. No.: 16/041,887

(22) Filed: Jul. 23, 2018

(65) Prior Publication Data

US 2019/0029142 A1  Jan. 24, 2019

(30) Foreign Application Priority Data

Jul. 24, 2017  (TW) ................................ 106210820

(51) Int. Cl.
*H05K 7/20* (2006.01)
*G06F 1/20* (2006.01)
*F04D 25/06* (2006.01)
*F04D 29/64* (2006.01)

(52) U.S. Cl.
CPC ..... *H05K 7/20172* (2013.01); *F04D 25/0613* (2013.01); *F04D 29/646* (2013.01); *G06F 1/20* (2013.01)

(58) Field of Classification Search
CPC ............ H05K 7/20172; F04D 25/0613; F04D 29/646; F04D 29/522; F04D 29/526; F04D 29/545; G06F 1/20
See application file for complete search history.

(56) References Cited

U.S. PATENT DOCUMENTS

| 2003/0011985 | A1* | 1/2003 | Jensen | ...................... G06F 1/18 361/679.48 |
| 2003/0099094 | A1* | 5/2003 | Coles | ................. H05K 7/20172 361/726 |
| 2003/0099561 | A1* | 5/2003 | Heydt | ................. F04D 25/0613 417/423.1 |

(Continued)

*Primary Examiner* — Charles G Freay
*Assistant Examiner* — Lilya Pekarskaya
(74) *Attorney, Agent, or Firm* — Bruce Stone LLP; Joseph A. Bruce

(57) ABSTRACT

A quick release cooling fan structure without wires includes a housing, a quick release member, a carrying member, and a conductive member. A motor is fixed and electrically connected to the carrying member, and the carrying member is quickly assembled to the quick release member in a rotate-in manner. An abutting block of the quick release member is engaged with the locking portion of the housing. The connecting piece of the quick release member cooperates with the groove of the housing for quick assembly, the conductive member is disposed in the first through hole, and the conductive end is inserted through the first and second through holes to come into electric contact with the conductive portion, and thus the internal electric connection inside the cooling fan can be achieved without the use of wires, and the assembly and disassembly of the cooling fan can also be achieved.

4 Claims, 5 Drawing Sheets

(56) References Cited

U.S. PATENT DOCUMENTS

| | | | |
|---|---|---|---|
| 2003/0138291 A1* | 7/2003 | Hixon | H02G 3/0616 |
| | | | 403/348 |
| 2003/0227757 A1* | 12/2003 | Vincent | H05K 7/20172 |
| | | | 361/796 |
| 2006/0032625 A1* | 2/2006 | Angelis | F04D 25/0613 |
| | | | 165/247 |
| 2006/0268509 A1* | 11/2006 | Marroquin | G11B 33/12 |
| | | | 361/679.54 |
| 2006/0275152 A1* | 12/2006 | Borowski | G06F 1/20 |
| | | | 417/360 |
| 2009/0162188 A1* | 6/2009 | Milks | F04D 29/703 |
| | | | 415/108 |

* cited by examiner

QUICK RELEASE COOLING FAN STRUCTURE WITHOUT WIRES

BACKGROUND

Field of the Invention

The present invention relates to a cooling fan, and more particularly to a quick release cooling fan structure without wires.

Related Prior Art

The application range of the cooling fan is very wide. For those products that need to dissipate heat, there is a need for installation of cooling fans, especially for electronic products that are prone to heat. However, in general, the inside of the cooling fan often needs to be electrically connected by wires to drive the rotor to rotate the fan blades. The assembling structure of the cooling fan is also quite troublesome, and needs to be assembled in a screw-locking manner, which is very inconvenient to use. Therefore, a quick release cooling fan structure without wires is needed.

The present invention has arisen to mitigate and/or obviate the afore-described disadvantages.

SUMMARY

The present invention provides a quick release cooling fan structure without wires, the main purpose of which is to achieve quick disassembly and assembly.

Another object of the present invention is to achieve electrical connection inside the cooling fan without wires.

To achieve the above objects, a quick release cooling fan structure without wires in accordance with the invention comprises:

a housing including an annular wall and a support wall, wherein the annular wall defines an accommodating space, and includes an inner wall surface facing the accommodating space, the support wall has two ends respectively coupled to the annular wall, one of the two ends of the support wall has a locking portion, the support wall includes a first surface and a second surface opposite to each other, the second surface faces the accommodating space, the support wall is provided with a first through hole and a first blocking portion located on the second surface to cover a part of the first through hole, the inner wall surface defines a groove, and a restricting protrusion is formed in the groove;

a quick release member having a front surface, and a rear surface facing the second surface, the quick release member further including a first section, a second section and a third section connected one another in sequence, wherein one end of the first section that is not connected to the second section is provided with an abutting block to be connected to the locking portion, the second section has a surrounding wall and a fixing protrusion located on the front surface, the surrounding wall is located around the fixing protrusion, a first receiving recess is formed between the surrounding wall and the fixing protrusion, the third section has a second through hole and a second blocking portion disposed on the front surface to cover a part of the second through hole, the third section further includes a limiting wall on the front surface to define a second receiving recess by cooperating with the first stepped portion and the quick release member, the second receiving recess is in communication with the first receiving recess, a rotate-in inlet is provided between the second blocking portion and the surrounding wall and in communication with the second receiving recess, one end of the third section that is not connected to the second section is provided with a connecting piece, the connecting piece is engaged in the groove, and includes an engaging protrusion to be engaged with the restricting protrusion;

a carrying member being a printed circuit board and including a main carrying portion and an engaging portion electrically connected to each other, wherein the engaging portion has one end coupled to the main carrying portion, the main carrying portion has a connecting hole, the carrying member is connected to the front surface of the quick release member, the main carrying portion is located in the first receiving recess, the engaging portion is disposed in the second receiving recess, the fixing protrusion is inserted through the connecting hole, the engaging portion has a conductive portion formed on a surface of the engaging portion facing the quick release member;

a conductive member connected to a power source, and including a body portion and a conductive end, wherein the conductive end is located at one end of the body portion, the conductive member is disposed in the first through hole, the conductive end is inserted through the first through hole and the second through hole to come into electric contact with the conductive portion;

a motor fixed and electrically connected to the carrying member, in such a manner that the fixing protrusion is fixed to the motor; and a fan impeller drivingly connected to the motor and disposed in the accommodating space.

By such arrangements, the motor is fixed and electrically connected to the carrying member, and the carrying member is quickly assembled to the quick release member in a rotate-in manner. The abutting block of the quick release member is engaged with the locking portion of the housing. The connecting piece of the quick release member cooperates with the groove of the housing for quick assembly, in such a manner that the conductive member is disposed in the first through hole, and the conductive end is inserted through the first through hole and the second through hole to come into electric contact with the conductive portion, and thus the internal electric connection inside the cooling fan can be achieved without the use of wires, and the assembly and disassembly of the cooling fan can also be achieved.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there are illustrated preferred embodiments of the invention.

DETAILED DESCRIPTION

The present invention will be clearer from the following description when viewed together with the accompanying drawings, which show, for purpose of illustrations only, the preferred embodiment in accordance with the present invention.

Figure 1:
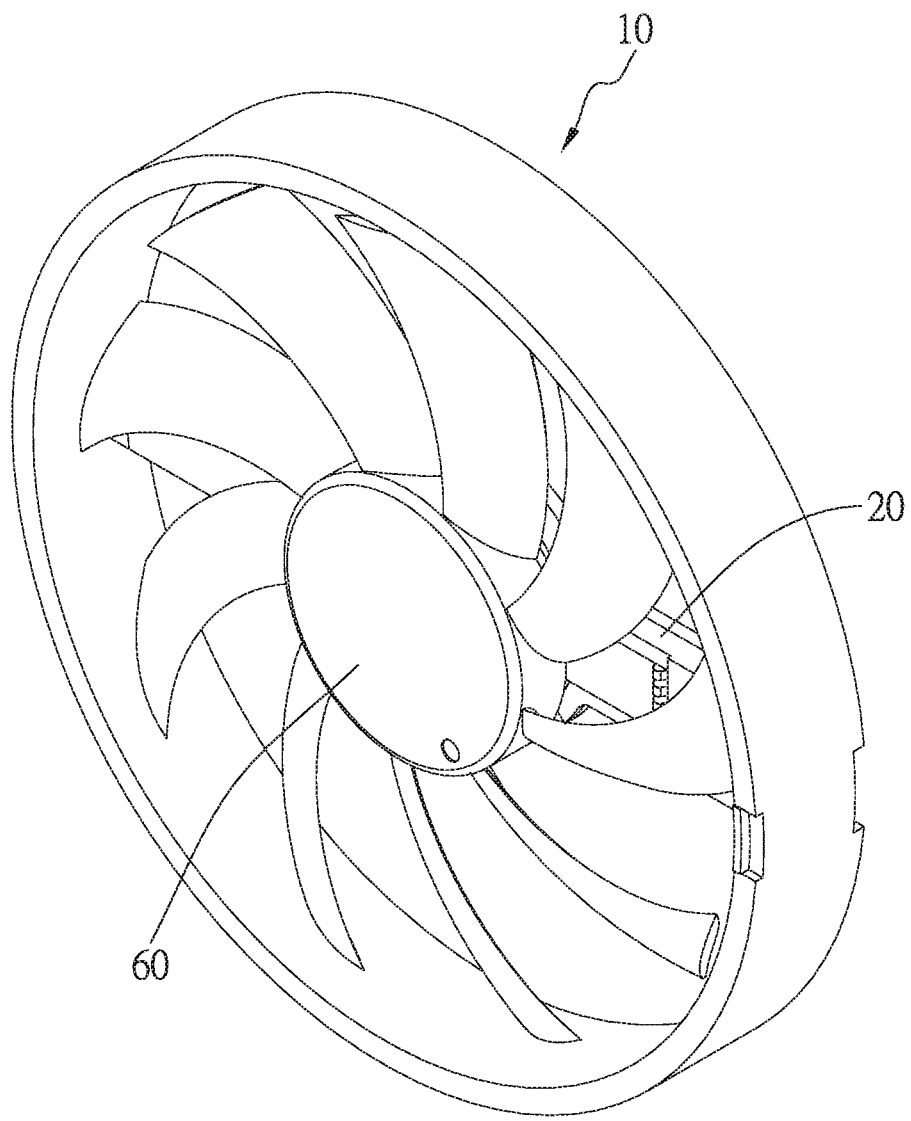
FIG. 1 is a perspective view of the quick release cooling fan structure without wires in accordance with the present invention.
Figure 2:
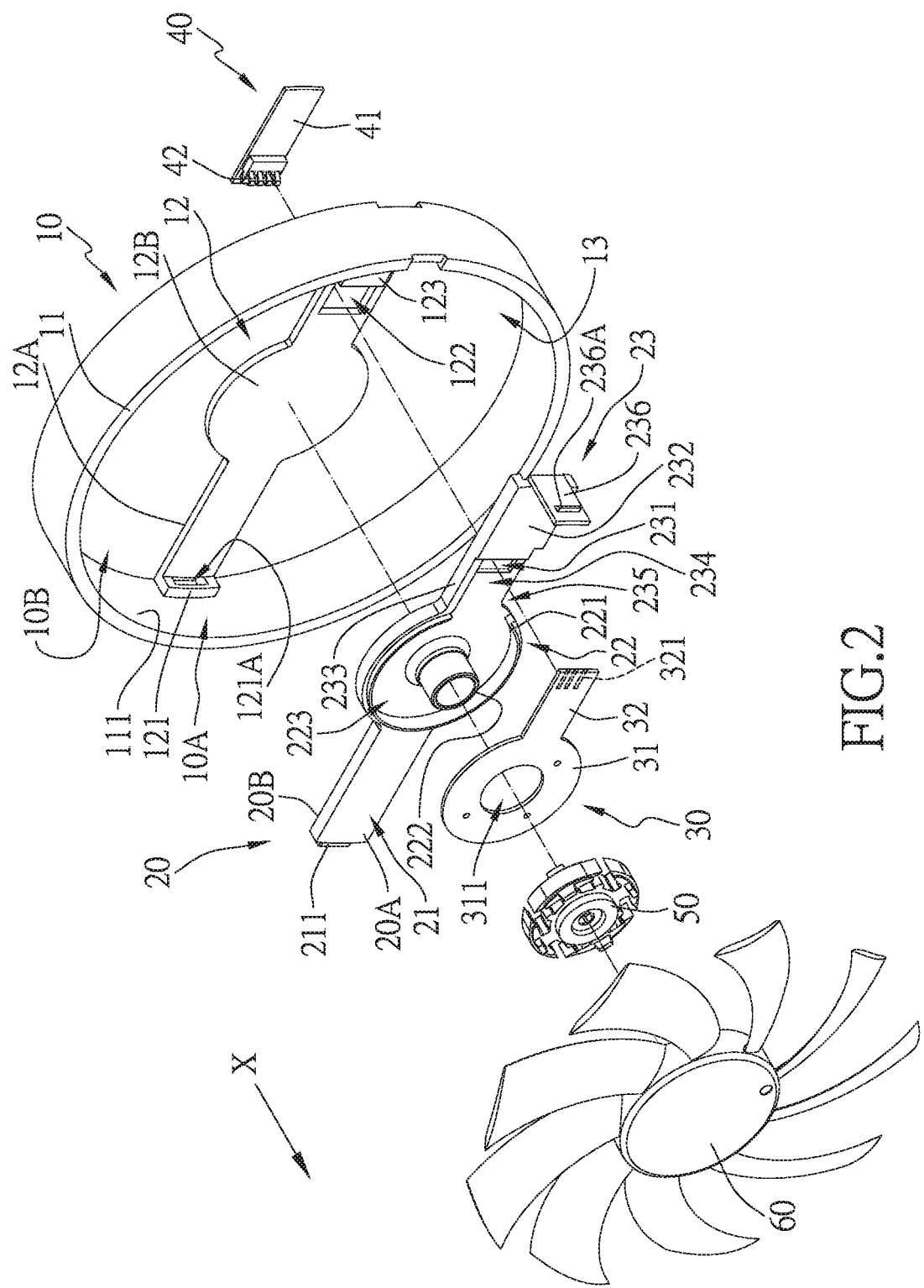
FIG. 2 is an exploded view of the quick release cooling fan structure without wires in accordance with the present invention.
Figure 3:
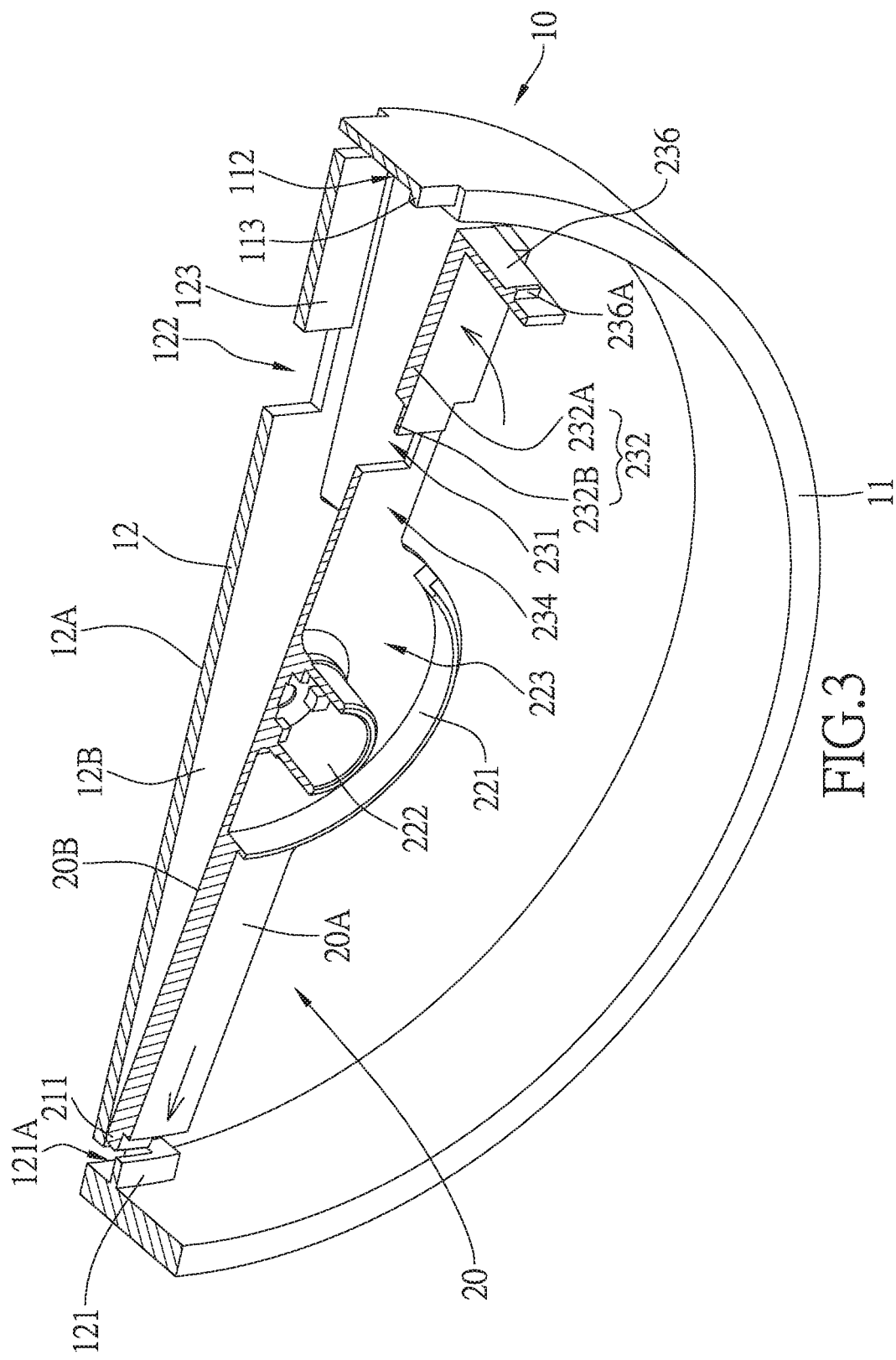
FIG. 3 is a cross sectional view of the quick release cooling fan structure without wires in accordance with the present invention.
Figure 4:
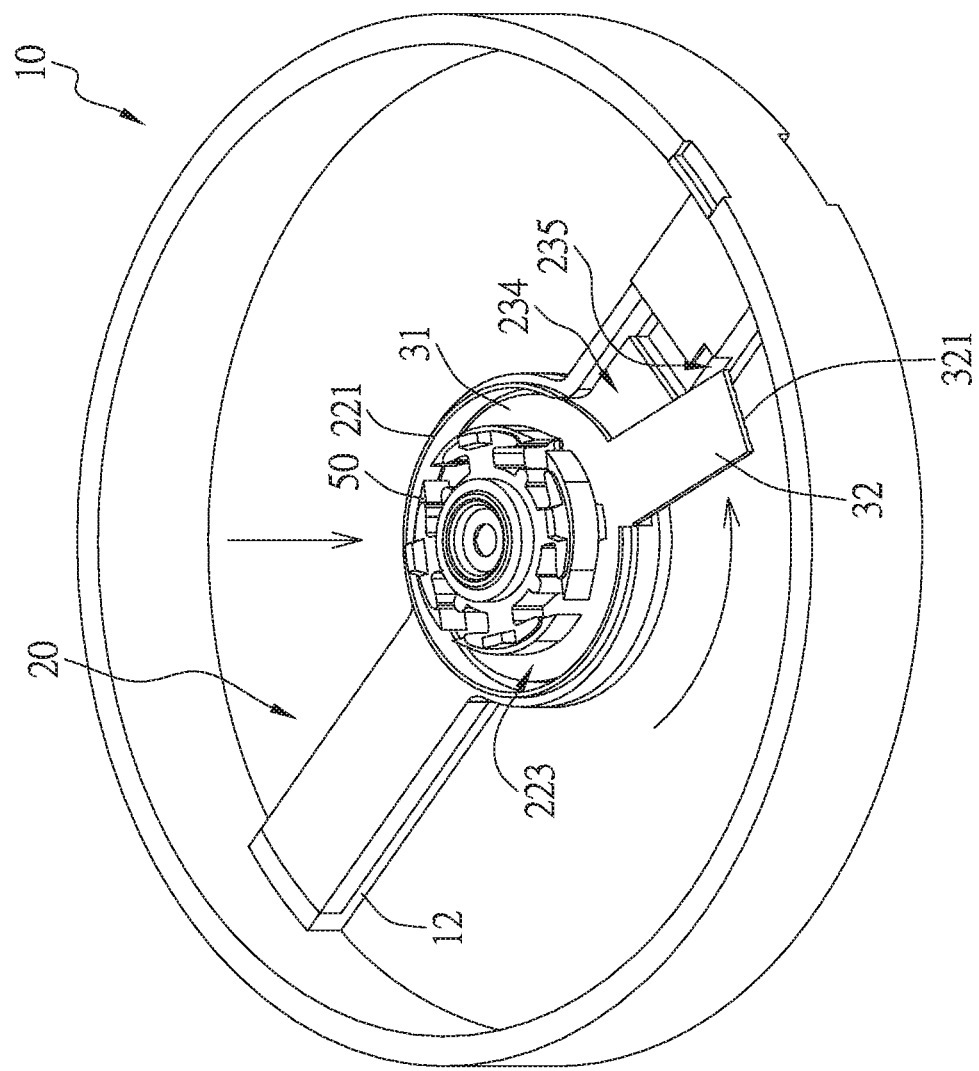
FIG. 4 is an assembly view of the quick release cooling fan structure without wires in accordance with the present invention.
Figure 5:
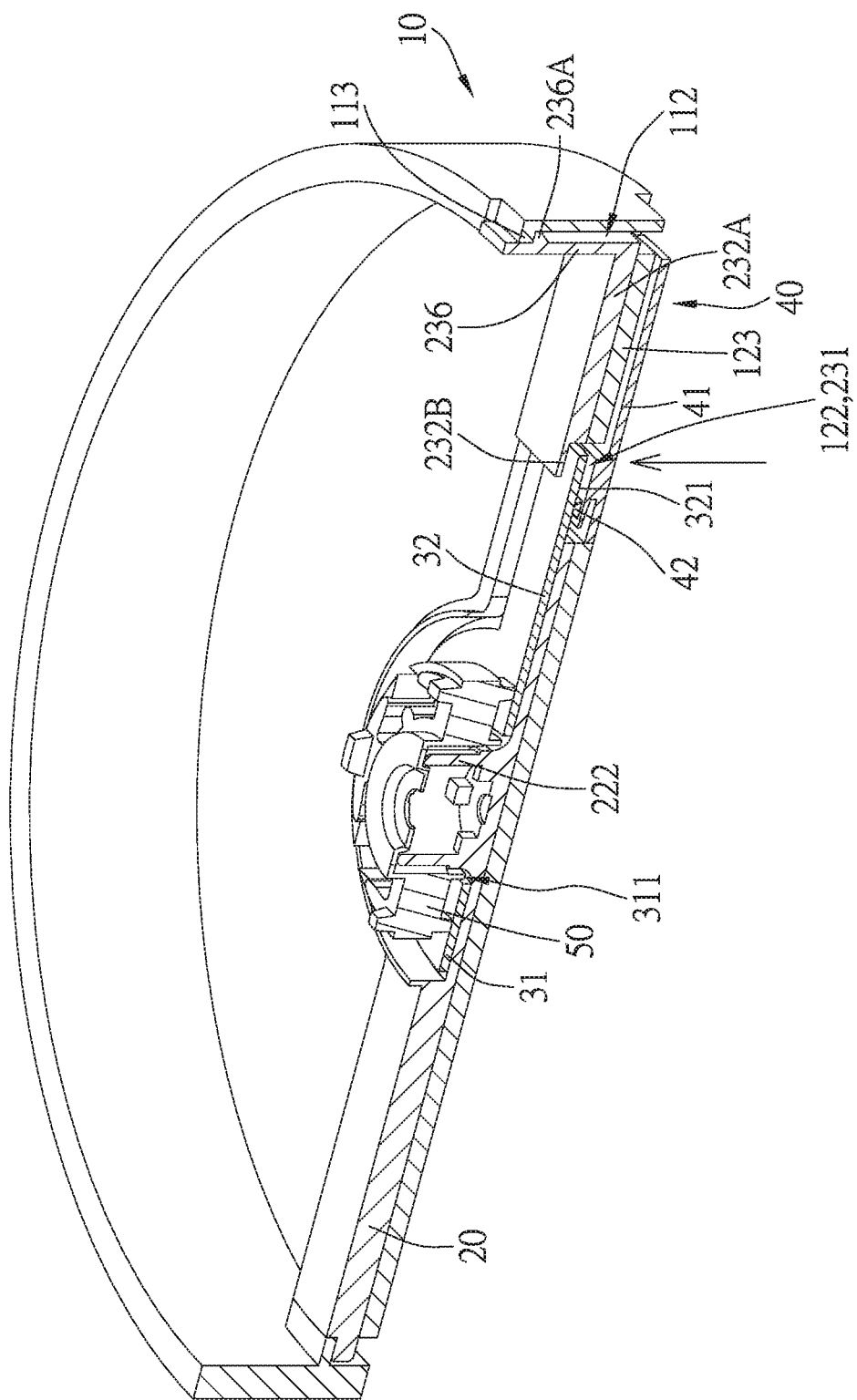
FIG. 5 is another assembly view of the quick release cooling fan structure without wires in accordance with the present invention.

Referring to FIGS. 1-5, a quick release cooling fan structure without wires in accordance with the present invention comprises: a housing 10, a quick release member 20, a carrying member 30, a conductive member 40, a motor 50, and a fan impeller 60.

The housing 10 includes an annular wall 11 and a support wall 12. The annular wall 11 has an annular shape to define an accommodating space 13, and an inner wall surface 111 facing the accommodating space 13. A first opening 10A and a second opening 10B in communication with each other are formed at two opposite sides of the annular wall 11. The support wall 12 is in the shape of a strip located in the second opening 10B, and has two ends respectively coupled to the annular wall 11. One end of the support wall 12 has a locking portion 121 located on the inner wall surface 111, and the locking portion 121 has a recess 121A. The support wall 12 includes a first surface 12A and a second surface 12B opposite to each other. The second surface 12B faces the accommodating space 13. The support wall 12 is provided with a first through hole 122 penetrating the support wall 12. The support wall 12 further includes a first blocking portion 123 located on the second surface 12B to cover a part of the first through hole 122. The inner wall surface 111 defines a groove 112 opposite to the other end of the support wall 12 having the locking portion 121, and a restricting protrusion 113 is formed in the groove 112.

A direction in which the first opening 10A extends to the second opening 10B is defined as an assembling direction X, and the groove 112 extends along the assembling direction X.

The quick release member 20 is an elongated plate having a shape corresponding to the shape of the support wall 12, and includes a front surface 20A facing the first opening 10A and a rear surface 20B attached to the second surface 12B of the support wall 12. The quick release member 20 further includes a first section 21, a second section 22 and a third section 23 connected in sequence. The first section 21 and the third section 23 are rectangular, and the second section 22 is circular. One end of the first section 21 that is not connected to the second section 22 is provided with an abutting block 211 to be inserted into the recess 121A. The second section 22 has a surrounding wall 221 and a fixing protrusion 222 located on the front surface 20A. The surrounding wall 221 is located around and a distance away from the fixing protrusion 222. A first receiving recess 223 is formed between the surrounding wall 221 and the fixing protrusion 222. The third section 23 has a second through hole 231 which is square and penetrates through the third section 23. The third section 23 has a second blocking portion 232 on the front surface 20A to cover a part of the second through hole 231. The first blocking portion 123 is received in the second through hole 231. The second blocking portion 232 includes a first stepped portion 232A formed on the front surface 20A, and a second stepped portion 232B formed on one side of the first stepped portion 232A that is not connected to the front surface 20A. The third section 23 further includes a limiting wall 233 on the front surface 20A to define a second receiving recess 234 by cooperating with the first stepped portion 232A and the quick release member 20. The second receiving recess 234 is in communication with the first receiving recess 223. A rotate-in inlet 235 is provided between the first stepped portion 232A and the surrounding wall 221 and in communication with the second receiving recess 234. One end of the third section 23 that is not connected to the second section 22 is provided with a connecting piece 236 extending along the assembling direction X. The connecting piece 236 is engaged in the groove 112, and includes an engaging protrusion 236A to be engaged with the restricting protrusion 113.

The carrying member 30 includes a main carrying portion 31 and an engaging portion 32 electrically connected with each other. The main carrying portion 31 is circular and the engaging portion 32 is rectangular. The engaging portion 32 has one end coupled to the main carrying portion 31. The main carrying portion 31 has a connecting hole 311. The carrying member 30 is connected to the front surface 20A of the quick release member 20. The main carrying portion 31 is located in the first receiving recess 223, the engaging portion 32 is disposed in the second receiving recess 234, and the fixing protrusion 222 is inserted through the connecting hole 311. The engaging portion 32 has a conductive portion 321 formed on a surface of the engaging portion 32 facing the quick release member 20 to receive power. In this embodiment, the carrying member 30 is a printed circuit board.

The conductive member 40 is connected to an external power source, and includes a body portion 41 and a conductive end 42. The conductive end 42 is located at one end of the body portion 41. The conductive member 40 is disposed in the first through hole 122, and the conductive end 42 is inserted through the first through hole 122 and the second through hole 231 to come into electric contact with the conductive portion 321.

The motor 50 is fixed and electrically connected to the carrying member 30, in such a manner that the fixing protrusion 222 is fixed to the motor 50 to enable the motor 50 to rotate relative to the fixing protrusion 222.

The fan blade 60 is drivingly connected to the motor 50 and disposed in the accommodating space 13.

What mentioned above are the configuration and characteristics of the quick release cooling fan without wires in accordance with the invention, and the assembly method of the invention is as follows.

Firstly, the motor 50 is fixed to the carrying member 30, and the two are electrically connected. Then, the main carrying portion 31 of the carrying member 30 is sleeved onto the fixing protrusion 222 and moved to the first receiving recess 223, and then rotating the carrying member 30 until the engaging portion 32 is rotated into the second receiving recess 234 via the rotate-in inlet 235, so that the engaging portion 32 is stopped by the second stepped portion 232B from falling out along the assembling direction X, and thus the carrying member 30 and the quick release member 20 are assembled together.

After that, the abutting block 211 is inserted into the recess 121A, the quick release member 20 is inclined at an angle, and then the connecting piece 236 is moved into the groove 112 along the assembling direction X, so that the engaging protrusion 236A and the restricting protrusion 113 are mutually engaged, which allows the quick release member 20 to be assembled to the housing 10.

The conductive member 40 is disposed in the first through hole 122, and the conductive end 42 is inserted through the first through hole 122 and the second through hole 231 to come into electric contact with the conductive portion 321.

Finally, the motor 50 is connected to the fan impeller 60 to complete the assembly operation.

By such arrangements, the motor 50 is fixed and electrically connected to the carrying member 30, and the carrying member 30 is quickly assembled to the quick release member 20 in a rotate-in manner. The abutting block 211 of the quick release member 20 is engaged with the recess 121A of the housing 10. The connecting piece 236 of the quick release member 20 cooperates with the groove 112 of the housing 10 for quick assembly, in such a manner that the conductive member 40 is disposed in the first through hole 122, and the conductive end 42 is inserted through the first through hole 122 and the second through hole 231 to come into electric contact with the conductive portion 321, and thus the internal electric connection inside the cooling fan can be achieved without the use of wires, and the assembly and disassembly of the cooling fan can also be achieved.

While we have shown and described various embodiments in accordance with the present invention, it is clear to those skilled in the art that further embodiments may be made without departing from the scope of the present invention.

What is claimed is:

1. A quick release cooling fan structure without wires comprising:
    a housing including an annular wall and a support wall, wherein the annular wall defines an accommodating space, and includes an inner wall surface facing the accommodating space,
        the support wall has two ends respectively coupled to the annular wall, one of the two ends of the support wall has a locking portion, the support wall includes a first surface and a second surface opposite to each other, the second surface faces the accommodating space, the support wall is provided with a first through hole penetrating the support wall and a first blocking portion located on the second surface to cover a part of the first through hole, the inner wall surface defines a groove, and a restricting protrusion is formed in the groove of the inner wall surface;
    a quick release member having a front surface, a rear surface facing the second surface, the quick release member further including a first section, a second section and a third section connected one another in sequence, wherein one end of the first section that is not connected to the second section is provided with an abutting block to be connected to the locking portion of the support wall, the second section has a surrounding wall and a fixing protrusion located on the front surface, the surrounding wall is located around the fixing protrusion, a first receiving recess is formed between the surrounding wall and the fixing protrusion, the third section has a second through hole and a second blocking portion, including a first stepped portion and a second stepped portion, disposed on the front surface to cover a part of the second through hole, the third section further includes a limiting wall on the front surface to define a second receiving recess by cooperating with the first stepped portion and the quick release member, the second receiving recess being in communication with the first receiving recess, a rotate-in inlet is provided between the second blocking portion and the surrounding wall and is being in communication with the second receiving recess, one end of the third section that is not connected to the second section is provided with a connecting piece, the connecting piece is engaged with the groove of the inner wall surface, and includes an engaging protrusion to be engaged with the restricting protrusion;
    a carrying member being a printed circuit board and including a main carrying portion and an engaging portion that are electrically connected to each other, wherein the engaging portion has one end coupled to the main carrying portion, the main carrying portion has a connecting hole, the carrying member is connected to the front surface of the quick release member, the main carrying portion is located in the first receiving recess that has been formed between the surrounding wall and the fixing protrusion, the engaging portion is disposed in the second receiving recess, the fixing protrusion is inserted through the connecting hole, the engaging portion has a conductive portion formed on a surface of the engaging portion facing the quick release member;
    a conductive member connected to an external power source, and including a body portion and a conductive end, wherein the conductive end is located at one end of the body portion, the conductive member is disposed in the first through hole, the conductive end is inserted through the first through hole and the second through hole to come into electric contact with the conductive portion;
    a motor fixed and electrically connected to the carrying member in such a manner that the fixing protrusion is fixed to the motor; and a fan impeller drivingly connected to the motor and disposed in the accommodating space.

2. The quick release cooling fan structure without wires as claimed in claim 1, wherein a first opening and a second opening being in communication with each other are formed at two opposite sides of the annular wall of the housing, the support wall is located in the second opening, a direction, in which the first opening extends to the second opening, is defined as an assembling direction, the groove of the inner wall surface extends along the assembling direction, and the front surface of the quick release member faces the first opening.

3. The quick release cooling fan structure without wires as claimed in claim 1, wherein the first stepped portion of the second blocking portion being formed on the front surface, and the second stepped portion of the second blocking portion being formed on one side of the first stepped portion that is not connected to the front surface.

4. The quick release cooling fan structure without wires as claimed in claim 1, wherein the locking portion located on the inner wall surface and has a block recess, and the abutting block is inserted in the block recess.

* * * * *